United States Patent

Pang et al.

[11] Patent Number: 5,986,941
[45] Date of Patent: Nov. 16, 1999

[54] PROGRAMMING CURRENT LIMITER FOR SOURCE-SIDE INJECTION EEPROM CELLS

[75] Inventors: Chan-Sui Pang, Sunnyvale; Yueh Yale Ma, Los Altos Hills, both of Calif.

[73] Assignee: Bright Microelectronics, Inc., Sunnyvale, Calif.

[21] Appl. No.: 08/948,145

[22] Filed: Oct. 9, 1997

[51] Int. Cl.$^6$ ..................................................... G11C 7/00
[52] U.S. Cl. ........................... 365/185.33; 365/185.15; 365/185.18
[58] Field of Search .................. 365/185.33, 185.15, 365/185.18, 185.13

[56] References Cited

U.S. PATENT DOCUMENTS

| | | | |
|---|---|---|---|
| 4,794,565 | 12/1988 | Wu et al. | 365/185 |
| 5,029,130 | 7/1991 | Yeh | 365/185 |
| 5,042,009 | 8/1991 | Kazerounian et al. | 365/185 |
| 5,278,439 | 1/1994 | Ma et al. | 257/319 |
| 5,280,446 | 1/1994 | Ma et al. | 365/185.15 |
| 5,455,792 | 10/1995 | Yi | 365/185 |
| 5,629,893 | 5/1997 | Tang et al. | 365/185.18 |
| 5,691,939 | 11/1997 | Chang et al. | 365/185.18 |
| 5,818,761 | 10/1998 | Onakado et al. | 365/185.11 |

OTHER PUBLICATIONS

Naruke, K. et al., "A New Flash–Erase EEPROM Cell with a Sidewall Select–Gate on its Source Side," IEDM, IEEE, 1989, pp. 603–606.

Yamauchi, Y. et al., "A 5V–Only Virtual Ground Flash Cell with an Auxiliary Gate for High Density and High Speed Application," IEDM, IEEE, 1991, pp. 319–322.

*Primary Examiner*—Vu A. Le
*Attorney, Agent, or Firm*—Patrick T. King

[57] ABSTRACT

A flash memory EEPROM device with a programming current limiting ability operates with six terminals and includes a source-side injection cell and a current limiter in series with the cell at a source region of the cell. During programming, an upper current limit is established for the overall channel current through the cell by controlling the voltage on a serial-gate of the current limiter. A second embodiment of a flash memory EEPROM device is structured with only four operating terminals, and includes a current limiting transistor integrally merged with a source-side injection cell. Merger is accomplished by eliminating the source junction of the injection cell and by combining the select-gate of the injection cell with the serial-gate of the current limiting transistor to create a conjoint select-gate. The unified channel under the conjoint select-gate consists of two channel sub-sections with different threshold adjustment implants and thus different threshold voltages. The first sub-section of this unique channel, adjacent to the injection point of the cell, is doped with a lower threshold adjustment implant dose than that of the second channel sub-section, adjacent to the source of the memory device. The second channel sub-section, or appended channel, in accordance with the second embodiment is fabricated using a dedicated photoresist mask to dope the second sub-section of the select-gate channel with a higher threshold adjustment implant dose than that for the first sub-section.

3 Claims, 8 Drawing Sheets

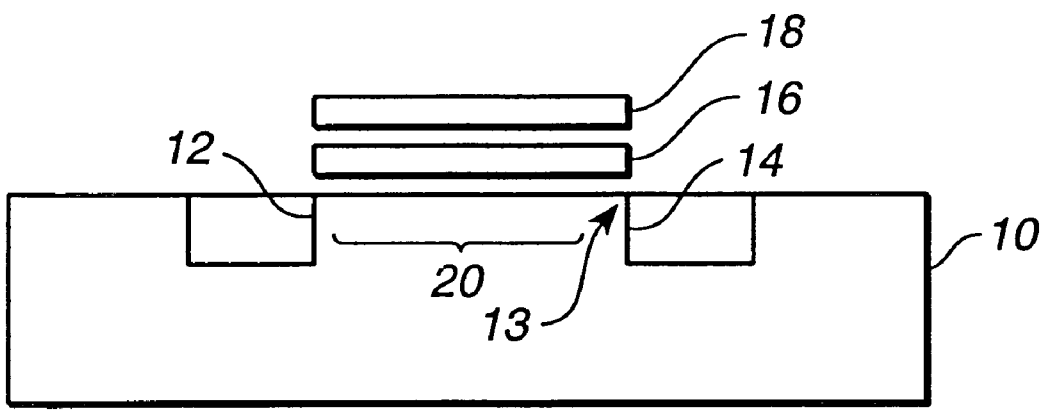
FIG._1
*(PRIOR ART)*
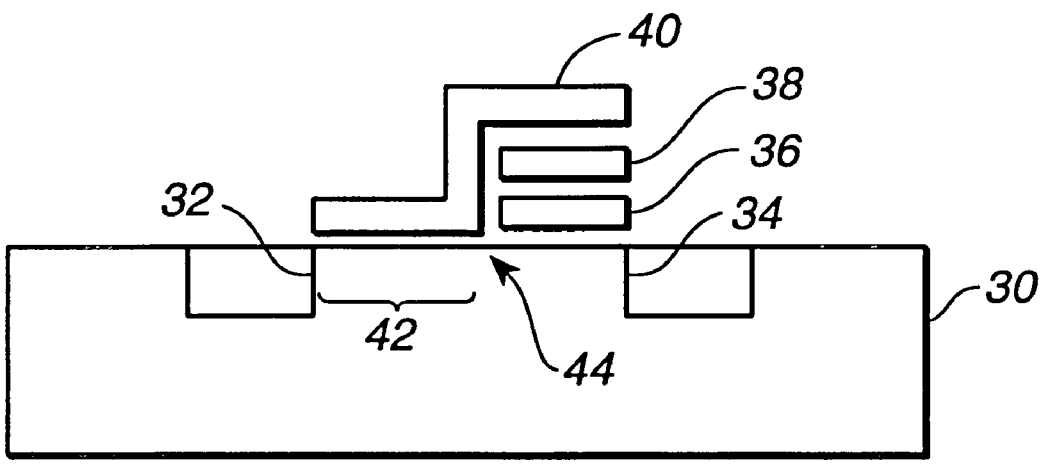
FIG._2
*(PRIOR ART)*

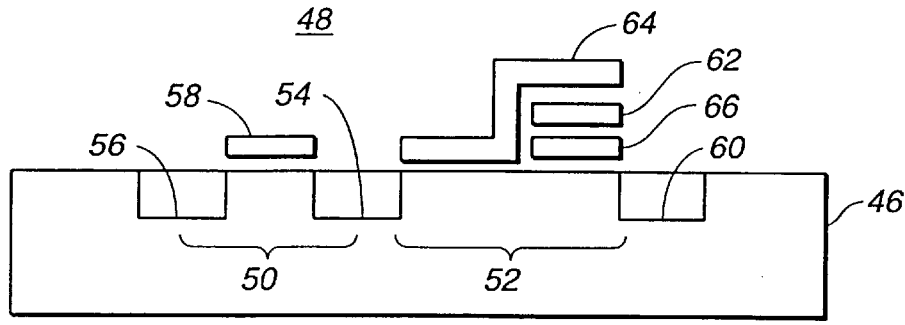
FIG._3
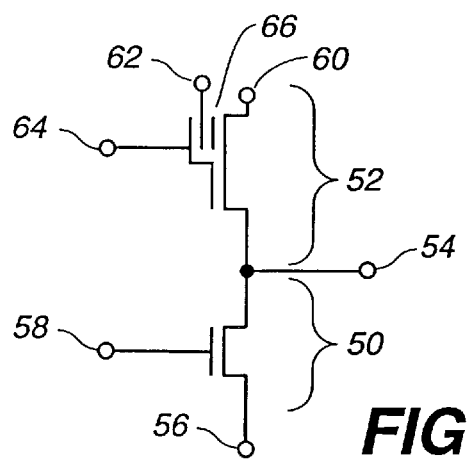
FIG._4A
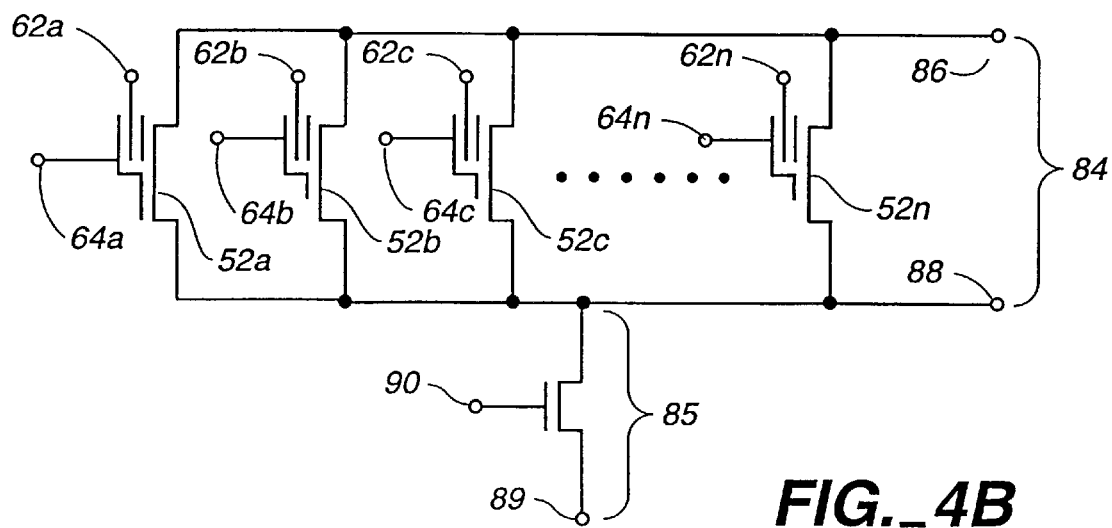
FIG._4B

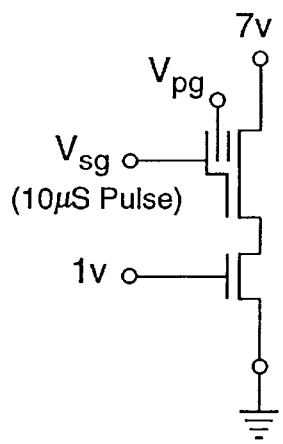
FIG._5A
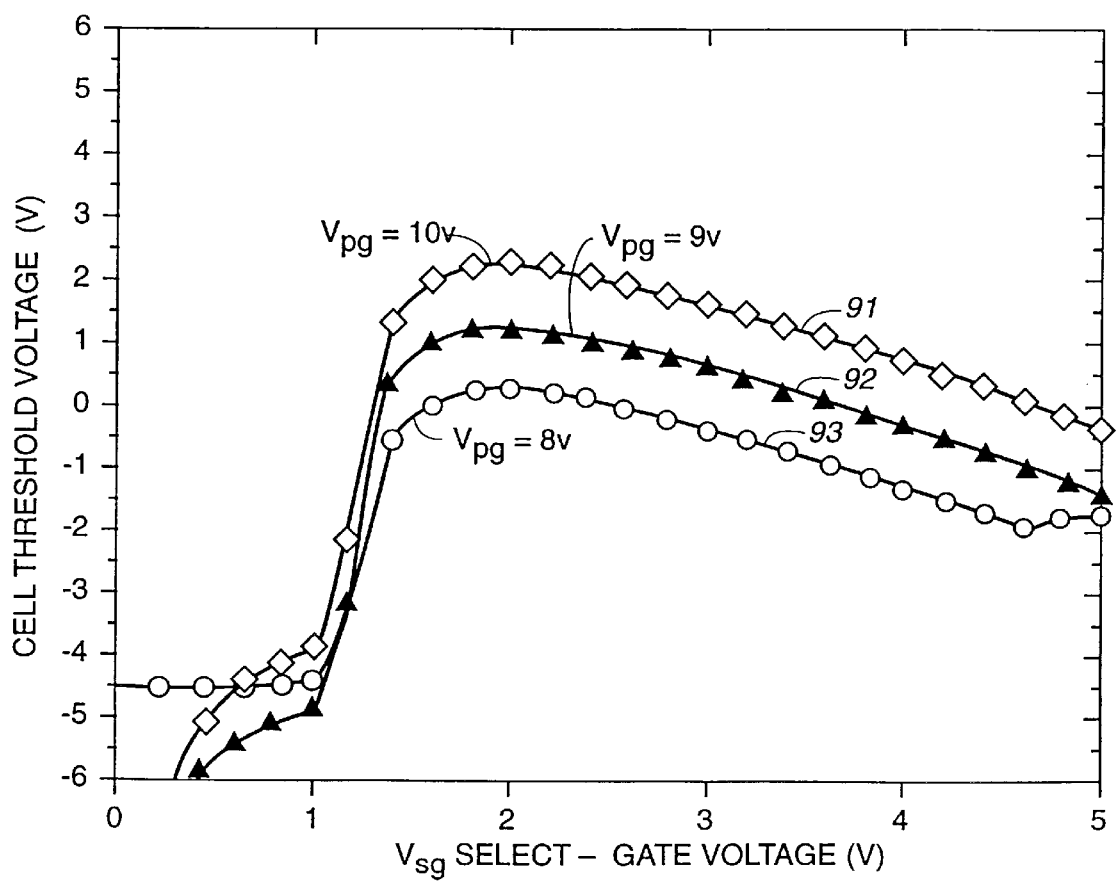
FIG._5B

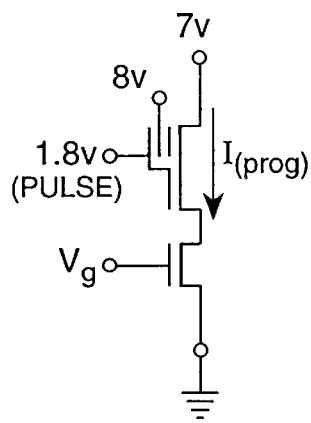
FIG._6A
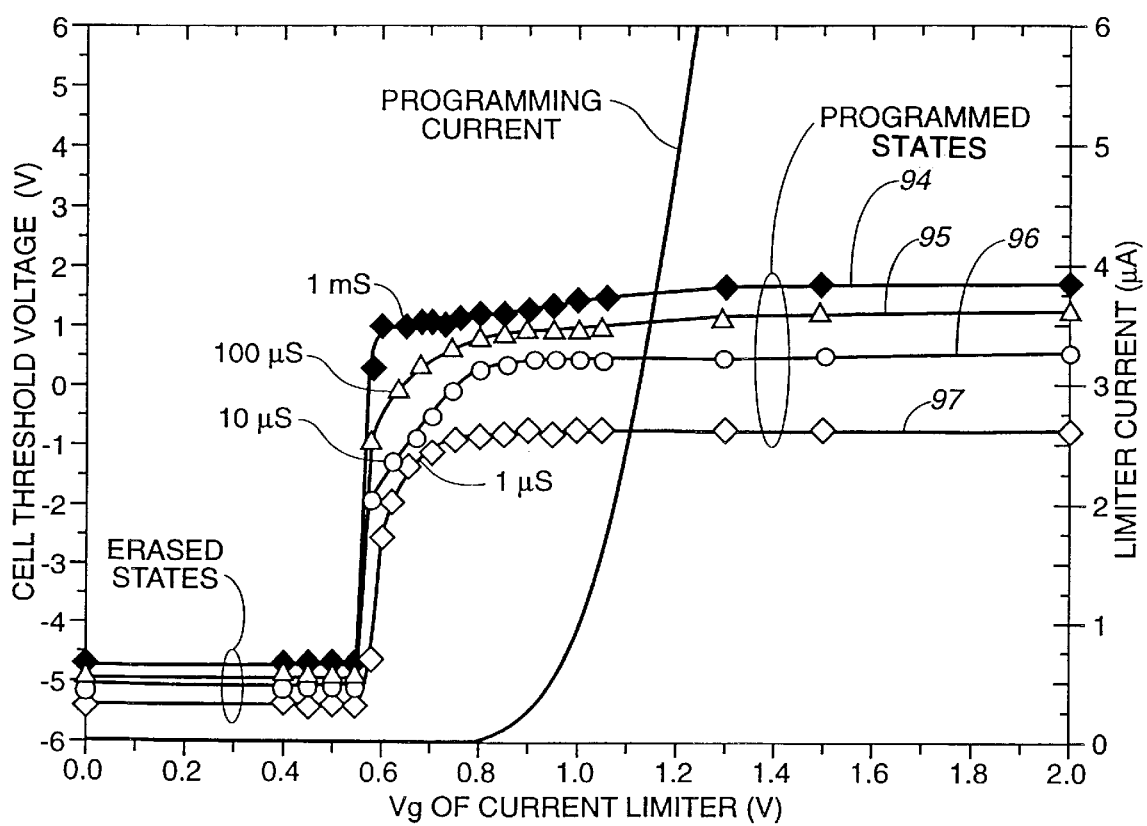
FIG._6B

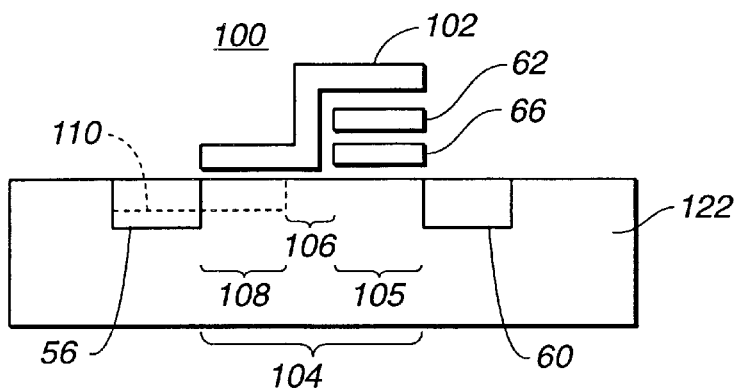
FIG._7
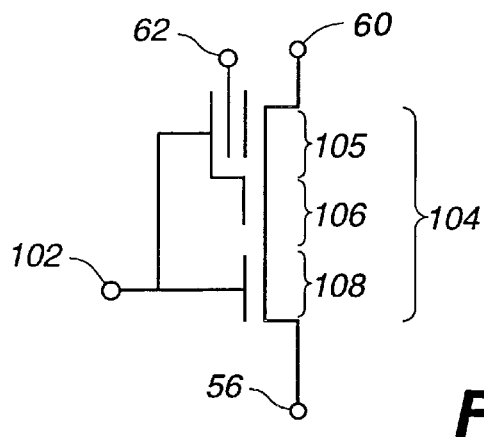
FIG._8A
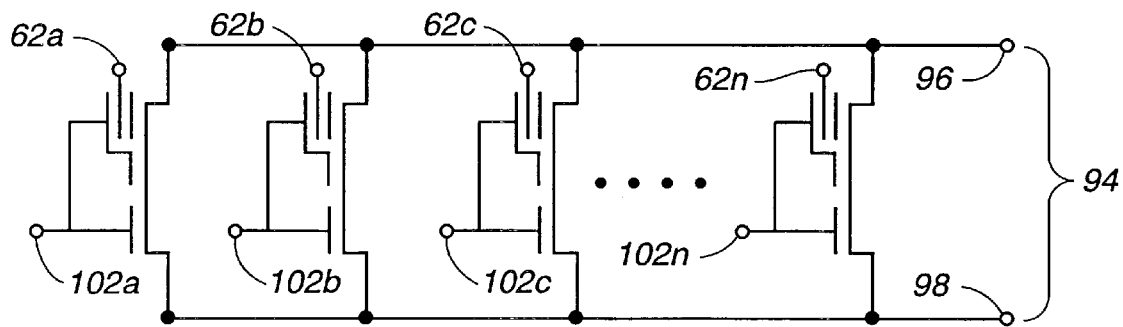
FIG._8B

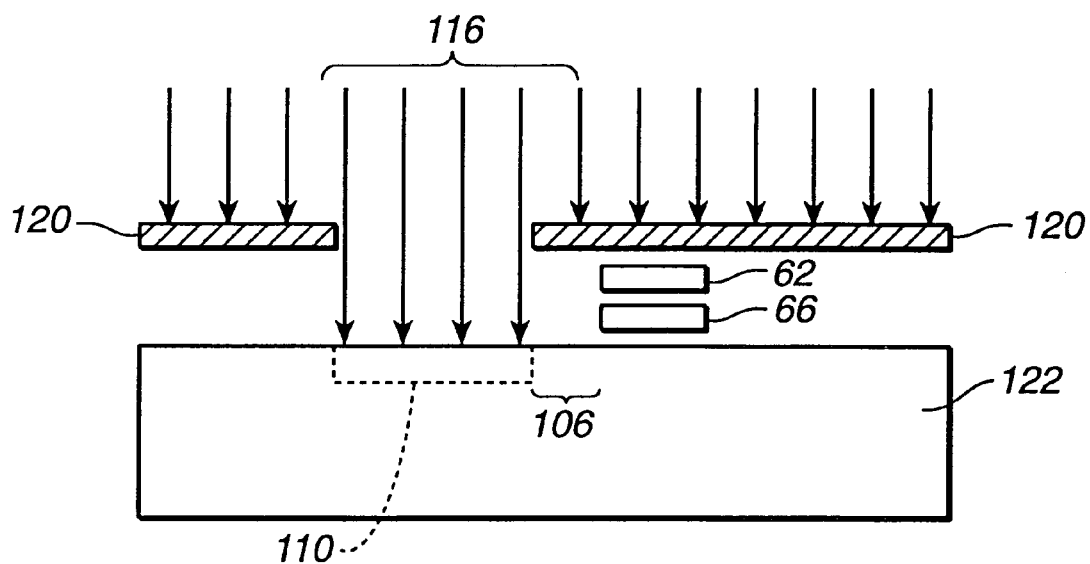
FIG._9A
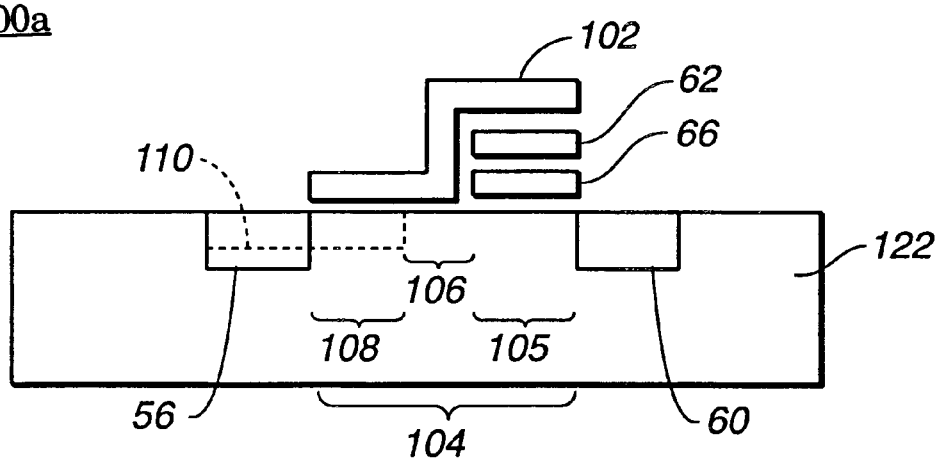
FIG._9B

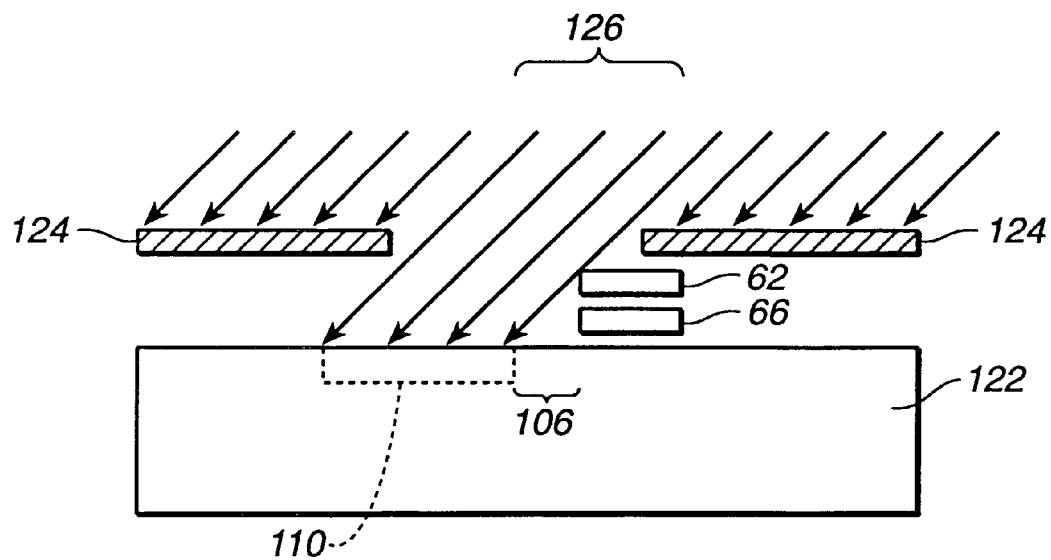
FIG._10A
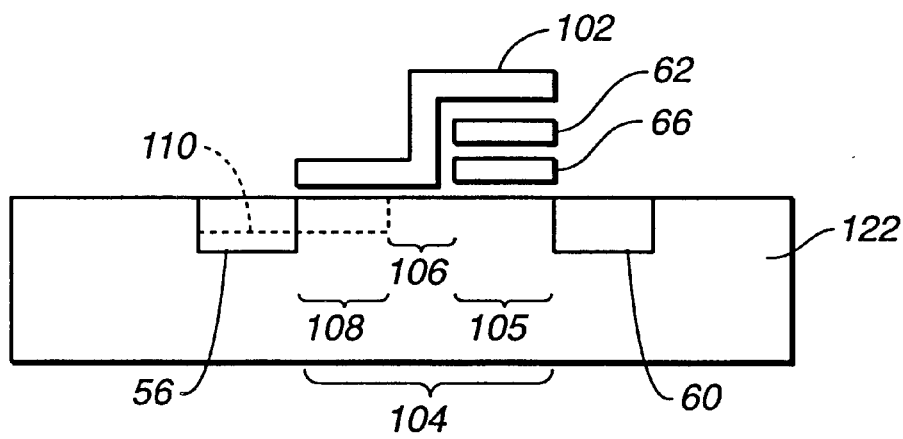
FIG._10B

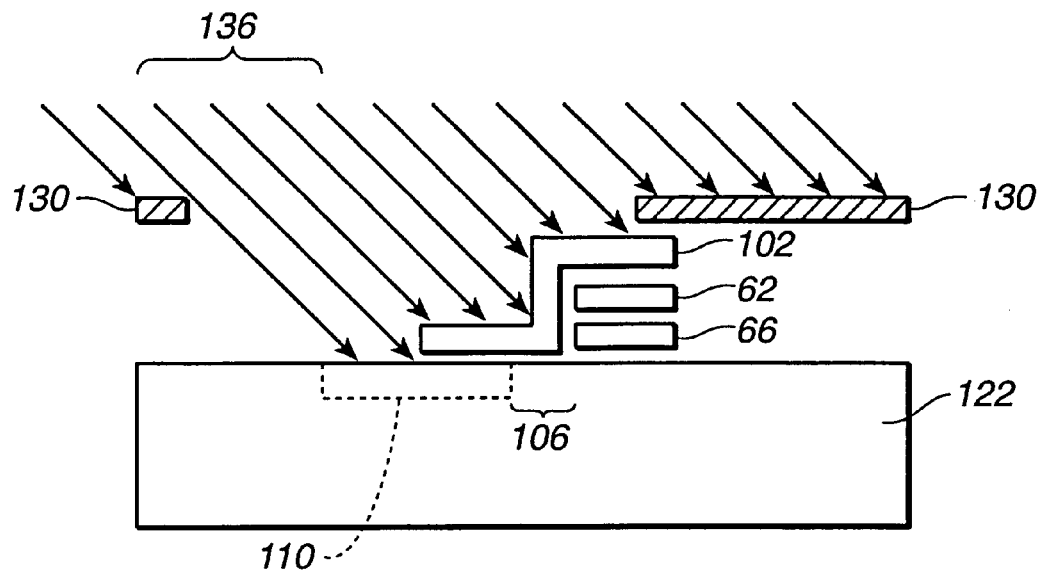
FIG._11A
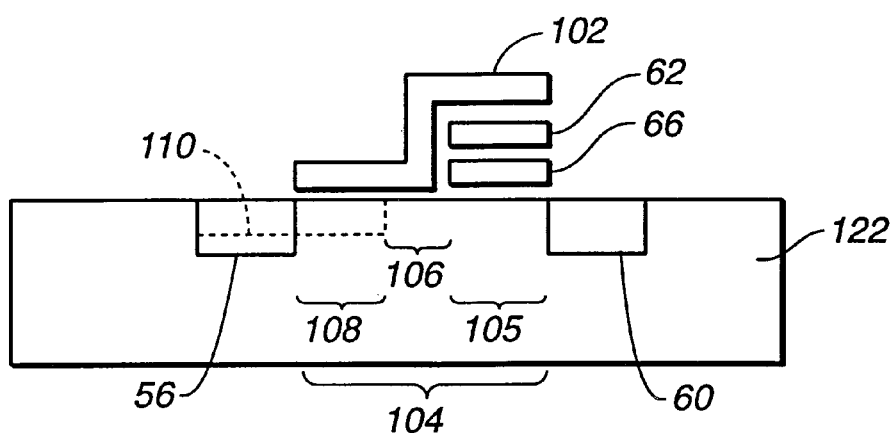
FIG._11B

PROGRAMMING CURRENT LIMITER FOR SOURCE-SIDE INJECTION EEPROM CELLS

TECHNICAL FIELD

This invention relates to non-volatile semiconductor memory devices. Specifically, it concerns a type of EEPROM (Electrically Erasable & Programmable Read-Only-Memory) known as "source-side injection EEPROM" cells, and methods for programming such cells.

BACKGROUND ART

This invention involves floating gate memory devices known as flash EEPROM. Flash EEPROM can be programmed by hot-electron injection and erased by Fowler-Nordheim electron tunneling.

There are two types of hot-electron injection EEPROM cells classified by the injection locations; they are referred to as "drain-side" injection cells and "source-side" injection cells. In a drain-side injection cell, hot-electrons are injected onto the floating gate from a point in the source-drain channel nearest the drain-side; while in a source-side injection cell, hot-electrons are injected onto the floating gate from a point in the source-drain channel nearest the source-side.

Typical drain-side injection cells require a structure with a conduction channel and a control-gate stacked on top of a floating gate. FIG. 1 shows a typical drain-side injection cell comprising a substrate 10, a source region 12, a drain region 14, a floating gate 16, and a control-gate 18. The three major operating terminals in this cell are the drain, the source, and the control-gate. In this figure, for clarity, the isolating dielectric layers are not shown between the various elements. In this structure a conduction channel 20, located between the source region 12 and the drain region 14, is covered by the floating gate 16. During programming, the drain-side injection takes place under the floating gate 16 at a point 13 nearest the drain 14.

Drain-side injection cells are often referred to as "single-channel", or "one-transistor" cells, because from the hot-electron generation point of view, a minimum of only one channel section is all that required to produce the drain-side hot-electrons injections. However, in practical applications, as appeared in various prior art, some drain-side injection cells were designed with additional serial channels or split-gates for the purposes of avoiding drain-to-source "short-channel punchthrough" vulnerability, or of overcoming the so-called "overerased" shortcoming existing in flash memory cells fabricated using "dual-polysilicon" process.

Source-side injection cells differ structurally and functionally from drain-side injection cells. A minimum of two serial channel sections are required for a source-side injection cell. Source-side injection cells can be constructed by modifying or extending the source-end of a one-transistor cell structure to include either: (1) a split-gate at the source-side of the simple single-channel cell such as in U.S. Pat. Nos. 5,280,446 and 5,278,439 per Ma et al., and U.S. Pat. No. 5,029,130 per Bing Yeh; or (2) a separate gate at the source-side of a single-channel cell such as papers in IEDM pp. 603–606, 1989 per Naruke et al., and IEDM pp. 319–322, 1991 per Yamauchi et al. In either case, a serial channel must be added immediately next to the source-side of the floating gate channel.

FIG. 2 shows a typical split-gate source-side injection cell comprising a p-type substrate 30, an n-type source region 32, an n-type drain region 34, a floating gate 36, a control-gate 38, a select-gate 40, a select-gate channel region 42 (that is the added serial channel 42), and a transitional channel region 44. The four major operating terminals in this cell are the drain, the source, the control-gate, and the select-gate. Again, for clarity, no isolating dielectric layers are shown between the various elements. The source-side injection takes place under the floating gate 36 at a point near the transitional channel 44. Note that the transitional channel 44 of FIG. 2 corresponds to the source terminal 12 of FIG. 1, hence dubbed the term "source-side injection."

The programming speeds of source-side injection cells and drain-side injection cells are comparable. However, a major difference between the source-side injection and the drain-side injection exists in the channel current requirements for programming the cells. That is, source-side injection cells require much less current to program than do drain-side injection cells.

The Kazerounian et al. U.S. Pat. No. 5,042,009 teaches a method for drain-side injection programming a floating gate transistor with a markedly reduced channel current. This patent shows a cell comprising a two-section channel region between a pair of associated source and drain regions. The channel region includes a first portion under a floating gate which is heavily doped and a second portion adjacent the source region which is more lightly doped. The device taught by Kazerounian et al. has only two polysilicon gates and it is programmed by a drain-side injection mechanism; it is therefore not adaptable to the type of memory array devices with which the present invention is intended to be used. Furthermore, as will become more evident in the following sections, the two channel portions described in the Kazerounian et al.'s dual-polysilicon cells must be doped in the opposite order of concentrations for threshold voltage adjustments in comparison to the present invention. This is due to the completely different underlying operation mechanisms between "dual-polysilicon" drain-side injection memory devices and a "triple-polysilicon" source-side injection memory devices.

SUMMARY OF THE INVENTION

As revealed in patented prior art and in published technical literature, source-side injection cell gains an advantage over drain-side injection cell in its superior programmability, according to which the required programming current for the source-side injection cell is substantially smaller than that required for a drain-side injection cell.

It is an object of the present invention to provide a method and apparatus to even further reduce the amount of channel current required to program memory devices of source-side injection cells without compromising on programming speed. Such power saving feature is particularly desirable for advanced memory chips.

A first embodiment of a flash memory EEPROM device in accordance with the present invention operates with six terminals. It includes source-side injection cell(s) and a current limiting transistor. The cell(s) and the transistor are connected in series, such that the source region(s) of the cell(s) and the drain region of the current limiting transistor are combined to become a conjoint terminal. During programming, the overall channel current through the cell is controlled by the voltage on the gate of the current limiting transistor, which sets an upper limit for the programming current. The injection cell(s) and the current limiting transistor are constructed on the same semiconductor substrate. For injection mode operation, the source terminal of the current limiting transistor is connected to ground, and the serial gate of the current limiting transistor is set to a voltage very close to, but slightly above, its threshold voltage, so that the conduction channel of the current limiting transistor is barely turned on. During programming, an upper limit can thus be set for the overall programming current by controlling the voltage on the gate of the current limiter. With this embodiment, as will be presented below, our measurements show that the injection cell's programming current can be drastically reduced while maintaining the same programming speed as that for the case of a typical, stand-alone, source-side injection without a current limiter.

With a current limiter, the programming current of the memory cell can be reduced, for example, to 30 nano-amperes, as opposed to about 15 micro-amperes for the case without the current limiter, with little or no sacrifice in programming speed. This represents an improvement of about 500 fold.

As an application of the first embodiment, a flash memory array is constructed with one current limiting transistor which is commonly shared by a parallel set of source-side injection cells.

A second embodiment of a flash memory EEPROM device is operated with only four terminals, (instead of six, as used in the first embodiment.) It includes a current limiting transistor integrally merged with a source-side injection cell. Merger is accomplished by eliminating the injection cell's source junction and merging the select-gate of the injection cell with the serial gate of the current limiting transistor to create a conjoint select-gate. The channel thus formed under the conjoint select-gate includes two channel sub-sections. Each of these sub-sections receives a different total dose of threshold adjustment implant and thus each has a different threshold voltage. The first sub-section of this channel, adjacent to the injection point of the cell, is doped with a lower threshold adjustment implant dose than that received by the second (or the so-called appended) sub-section, adjacent to the source of the memory device. With proper additional doping applied to the second channel sub-section, its threshold voltage matches the optimal programming voltage of the select-gate belonging to the first channel sub-section. In practice, when the threshold voltage of the second channel sub-section is, for example, about 0.5 volts higher than the threshold voltage of the first channel sub-section, the programming current of the memory cell is minimized.

As an application of the second embodiment a memory array is constructed as a limited-programming-current memory array with the four-terminal integral source-side injection cells of the second embodiment greatly simplifying the array architecture and its operating conditions.

In accordance with the second embodiment, the required differential threshold voltage of the second, or appended, channel sub-section can be fabricated by, but not limited to, three methods. For each method, the key process steps for achieving the needed heavier threshold implant for the appended channel sub-section are described.

The first of such methods uses a dedicated photoresist mask for doping one portion of the appended channel which requires heavier doping concentration where the channel region (i.e., the second sub-section under the conjoint select-gate) that receives the heavier threshold doping is solely defined by the photoresist mask itself. This is a simple and straightforward way to achieve the two threshold voltages for the two respective directly joined channel sub-sections. With this method, however, because of the mask alignment limitations imposed by the mask stepper, the appended channel's total length tends to be long in order to accommodate the mask's mis-alignment error; therefore, the resulted cell-size is larger than those made by the other two proposed methods to be described below.

The second and third methods achieve shorter total channel-length of the appended channel sections so that the cell-size can be made smaller as compared with the first method. The basic principle here is to form the appended channel sub-sections by using self-alignment schemes, so that the mask mis-alignment error are not a contributing factor in determining the actual channel-lengths.

The second method uses a tilted angle threshold implant, where the self-alignment occurs by defining the heavier threshold implanted area through a shadowing technique using a readily formed "stack-gate structure" of the control-gate and floating gate. This method forms two different doping sub-sections by shadow-blocking of the control-gate and floating gate stack.

The third method also uses a tilted angle threshold implant, but the tilting direction is different than that of the second method. In this scheme, self-alignment occurs by defining the heavier threshold implanted area through the readily formed conjoint select-gate and the source terminal is subsequently defined with a normal angled (untilted) implant in the same masking step.

Briefly, for the second embodiment, the three proposed fabrication methods for forming the heavier implant appended channel section are: the first method is a not self-aligned, so that the appended channel length of the integral memory cell thus made is not minimized and results in larger cell-size; the second method self-aligns the implanted area to the control-gate; and the third method self-aligns the implanted area to the source junction and the select-gate of the integral memory device.

BRIEF DESCRIPTION OF THE DRAWINGS

FIG. 1 is a sectional view of a typical drain-side injection EEPROM memory cell known in the prior art.

FIG. 2 is a sectional view of a typical source-side injection EEPROM memory cell known in the prior art.

FIG. 3 is a sectional view of a first embodiment of the present invention which is a source-side injection cell with a current limiting transistor in series.

FIG. 4A is a schematic circuit diagram of a memory device of the first embodiment of the present invention shown in FIG. 3.

FIG. 4B is a circuit diagram of one segment of a memory array using a number of source-side injection cells with a commonly shared current limiting transistor and presenting one application example of the first embodiment.

FIG. 5A shows the test setup for FIG. 5B.

FIG. 5B shows data collected from the six-terminal memory device of FIGS. 3 and 4A where the cell's threshold voltage is plotted as a function of voltage applied to the select-gate (Vsg) of a memory cell for three different control-gate voltages (Vpg), the programming currents in these measurements were kept below 1 $\mu$A by setting the voltage of the serial gate at 1 volt, and the programming time for these plots was 10 $\mu$S.

FIG. 6A shows the test setup for FIG. 6B.

FIG. 6B shows data plots of the cell's threshold voltage and the programming current of the six-terminal device of FIGS. 3 and 4A as a function of voltage applied to the serial gate (Vg) of the current limiting transistor where these data show the programmability of the six-terminal memory device is a weak function of the programming current once the limiting transistor starts to conduct and where the data here includes four different programming speeds while the drain is at 7 volts and the control-gate is at 8 volts.

FIG. 7 is a sectional view of a second embodiment of the invention which is an integral device formed by combining a source-side injection cell together with a current limiting transistor where the channel of such conjoint cell includes three channel sections with one section located directly under the floating gate, and with two sub-sections located directly under the conjoint select-gate.

FIG. 8A is a circuit schematic diagram of the second embodiment of the invention shown in FIG. 7.

FIG. 8B is a circuit diagram of one segment of memory array which includes a number of the integral memory cells with each cell having a conjoint select-gate and presenting one application example of the second embodiment.

FIG. 9A is a sectional view of the integral memory device during a key masking step for the formation of a heavier implanted sub-section of the appended channel during a first fabrication method for the second embodiment of the invention using non-self-aligned threshold implant.

FIG. 9B shows the integral device at its process completion.

FIG. 10A is a sectional view of the integral memory device during a key masking step for the formation of a heavier implanted sub-section of the appended channel during a second fabrication method for the second embodiment of the invention which uses a tilted implant and is self-aligned to the stacked control-gate through a shadowing effect.

FIG. 10B shows the integral device at its process completion.

FIG. 11A is a sectional view of the integral memory device during a key masking step for the formation of a heavier implanted sub-section of the appended channel during a third fabrication method for the second embodiment of the invention which uses a complementary tilted implant and is self-aligned to the source junction and select-gate.

FIG. 11B shows the integral device at its process completion.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it should be understood that they are not intended to limit the invention to these embodiments. On the contrary, the invention is intended to cover alternatives, modifications and equivalents, which are included within the spirit and scope of the invention as defined by the appended claims.

FIG. 3 shows a first embodiment of the memory device 48, having a source-side injection cell 52, and a current limiting transistor 50, on same substrate 46, according to the instant invention.

Conventional dielectric layers (not shown in FIG. 3 for graphical clarity purpose) are used between the various elements. These include gate-oxides located between gate 58, select-gate 64 and substrate 46; tunnel-oxide located between floating gate 66 and substrate 46; and the various inter-polysilicon dielectrics between the floating gate 66 and control-gate 62, and between select-gate 64 and the floating and control gates.

A dedicated current limiting transistor 50 is connected in series to the source 54 of a source-side injection cell 52. The improved memory device 48 has a drain 60, a floating gate 66, a control-gate 62, a select-gate 64, a serial gate 58, and a device source 56. In the injection mode for programming, the source 56 is connected to ground and the gate 58 of the current limiting transistor 50 is set to a voltage slightly above the transistor's threshold voltage which barely turns on the current limiting transistor 50. The current limiting transistor 50 defines an upper limit of the programming current which flows through the channel region located between the drain 60 and the source 54 of the source-side injection cell 52 and that flows through the channel of the current limiting transistor 50 before entering the grounded device source 56.

With the cell's drain 60, the control-gate 62, and the select-gate 64 being set at their normal programming voltages, the memory cell 52 with its floating gate 66 can now be programmed with a limited channel current which is controlled by the pre-set voltage on the serial gate 58 of the current limiter 50. This device, with the inclusion of the current limiting transistor, maintains the same programming speed of the stand-alone source-side injection EEPROM cells, such as that represented by FIG. 2 or that as represented by the memory cell 52 in FIG. 3.

Without the current limiter, the programming current of the cell 52 is about 15 micro-amperes. With the inserted current limiting transistor 50 of FIG. 3, the programming current of the cell is reduced to only 30 nano-amperes. This represents an improvement of about 500 fold in reducing programming current while still maintaining the same programming speed.

FIG. 4A shows a schematic circuit diagram of a single memory device which uses a source-side injection cell according to the first embodiment of the invention shown in FIG. 3. This configuration of a memory device has six operating terminals as follows: The current limiting transistor 50 includes: (1) a source terminal 56, (2) a serial gate terminal 58, and (3) a drain terminal connected to a common terminal 54. The source-side injection cell transistor 52 includes: (1) a select-gate terminal 64, (2) a control-gate terminal 62, and (3) a drain terminal 60. Note that the common terminal 54 is shared by the cell transistor 52 and the current limiting transistor 50. Also note that the memory cell's floating gate is indicated as 66 in this figure and is a charge storage node, not an accessible terminal.

As an operating example, using FIGS. 3 and 4A for the first embodiment of the invention, we now demonstrate the device operation in three functioning modes:

(A) During program-mode: About 7v is applied to drain terminal 60, about 9v is applied to the control-gate 62, about 2v is applied to the select-gate 64, about 1v is applied to the serial gate 58 (the transistor 50 threshold voltage is about 0.6 to 0.7v,) and the device's source 56 is at ground potential. Note that, in this mode, the shared terminal 54 is free to be on its own, with no forced potential impressed thereupon. Under such conditions, electrons are injected onto the floating gate 66.

(B) During read-mode: Unlike the programming case, the limiting transistor 50 may be set to inactive in this mode. The serial gate 58 is set at ground, and the device's source 56 is now blocked or cut-off, without any forced potential. The cell's drain 60 is grounded, while the control-gate 62 may be set at ground (or at about 1v), and the select-gate 64 is at about 5v (or 3.3v). The memory cell's read current may be sensed at the mid-terminal 54 by applying a voltage of about 1.2v. Depending on the status of the stored charges in the floating gate 66, the current flowing through the cell's channel can be either high or low, representing the logic states or memory data of "one" or "zero", respectively. Note that with these settings the cell current is to flow in the opposite direction as compared to that in the write-mode, so that hot-electron (or the so-called soft-write effect) in the read-mode is minimized. Optionally, however, for applications where the read-disturb is not a severe requirement, the memory device may be read by sensing the cell current at the drain 60 terminal while grounding the mid-terminal 54 in a reverse direction of the current flow.

(C) During erase-mode: The select-gate 64 is set at ground, while the control-gate 62 is at negative 10v, and the cell's drain 60 is at about 5v. Under such conditions, electrons are removed from the floating gate 66 by a so-called tunneling mechanism. Note that the limiting transistor 50 is also inactive in this mode, because the grounded select-gate 64 isolates the mid-terminal 54 and the device source 56.

As an array application, FIG. 4B shows a circuit diagram of a segment of memory array 84 which uses a common current limiter 85 for "n" number of source-side injection memory transistors 52a, 52b, 52c, - - - 52n, which are similar to the memory cell transistor 52 of FIG. 3. The drain terminals of the injection cell transistors 52a, 52b, 52c, - - - 52n are commonly connected to a common drain terminal 86. The source terminals of the injection cell transistors 52a, 52b, 52c, - - - 52n are commonly connected to a common source terminal 88. The cell control-gate terminals 62a, 62b, 62c, - - - 62n, and the cell select-gate terminals 64a, 64b, 64c, - - - 64n, of the injection cell transistors 52a, 52b, 52c, - - - 52n may be independently connected to respective control-gate voltages and select-gate voltages to provide independent address selection and data control of each memory cell. The common current limiter transistor 85 has a device source terminal 89, a serial gate terminal 90 and a drain terminal connected to the common source terminal 88.

For the memory array segment of FIG. 4B, the methods of operation for program, read, and erase modes are similar to those described for FIGS. 3 and 4A above.

The graphs of FIGS. 5B and 6B show measured data compiled during injection-mode operation of the six-terminal device shown in FIGS. 3 and 4A. FIGS. 5A and 6A show their respective measurement conditions. The channel width of the cell 52 is 0.7 micrometers, the length of the floating gate 66 is 0.6 micrometers, and the length of the select-gate 64 is 0.7 micrometers.

In FIG. 5B, the three plots show the cell's threshold voltages (which is a programmable entity or variable) as a function of the select-gate voltage Vsg, for three different control-gate voltages of Vpg=8v, 9v, and 10v, respectively. The programming time for these data points was kept constant at 10 micro-seconds in each condition. All of the data shown in FIG. 5B were compiled under the following conditions of FIG. 5A (in reference to FIG. 4A): one volt was applied to the serial-gate 58 of the current limiting transistor 50; seven volts were applied to the drain terminal 60 of the memory cell 52; and the source terminal 56 of the current limiting transistor 50 was connected to ground.

The difference between the three plots of FIG. 5B lies in the different voltages applied to the control-gate 62 of the memory cell 52. For the first plot 91, with points illustrated as diamonds, ten volts were applied to the control-gate 62 of the memory cell 52. For the second plot 92, with points illustrated as triangles, nine volts were applied to the control-gate. For the third plot 93, with points illustrated as circles, eight volts were applied to the control-gate. As can be seen from these plots, the optimal select-gate's programming voltage occurs at about 1.8v at the graphs' humps. Under such optimal write conditions the programming currents were measured to be about 0.5 micro-amperes, as depicted in FIG. 6B below.

FIG. 6B shows two superimposed plots of the cell's programmed threshold voltage and of the cell's programming current flowing through the current limiting transistor 50 and the cell 52 itself (refer to FIGS. 3 and 4A) as a function of the serial gate's voltage Vg applied to terminal 58 of the current limiting transistor 50. The two vertical Y-axes are for the cell's threshold voltage and for the cell's programming current, respectively. The cell threshold voltage is shown along the left-hand vertical axis of the plot; and the cell programming current is shown along the right-hand vertical axis. The programming currents shown in FIG. 6B were obtained under the test conditions of FIG. 6A, where 8 volts were applied to the control-gate 62 of the memory cell 52; 7 volts were applied to the drain terminal 60 of the memory cell 52; programming signals with an amplitude of 1.8 volts and various pulse durations were applied to the select-gate 64 of the memory cell 52; and the source terminal 56 of the current limiting transistor 50 was connected to ground.

The differences between the cell's threshold voltages for the four plots of FIG. 6B lie in the differences between the effective programming pulse durations of the write signals applied to the select-gate terminal of the memory cell. For the first plot 94, with points illustrated as solid diamonds, a write signal with a pulse duration of 1 millisecond was applied to the select-gate of the memory cell. For the second plot 95, with points illustrated as triangles, a write signal with a pulse duration of 100 micro-seconds was applied to the select-gate of the memory cell. For the third plot 96, with points illustrated as circles, a programming signal with a pulse duration of 10 micro-seconds was applied to the select-gate of the memory cell. For the fourth plot 97, with points illustrated as unshaded diamonds, a write signal with a pulse duration of 1 micro-second was applied to the select-gate of the memory cell.

FIG. 6B shows the programmed threshold voltages of a cell as a function of the voltage on the serial-gate having a step-like characteristic. At a serial-gate voltage Vg of approximately 0.6 volts, where the current limiter begins to turn on (it should be noted that, at Vg of 0.6v to 0.8v, the channel current is very small (but not zero, although not showing up in the scale of FIG. 6B) and the cell's threshold voltage takes an abrupt jump from an erased state to a programmed states.

At serial-gate voltage of about 0.8 volts, all of the cell's threshold voltages are brought to near saturation while the channel current is only about 30 nanoamperes. It is important to note that the programmed threshold voltages of the memory cell are practically the same for serial-gate voltages greater than about 0.8 volts. The cell's programming current in microamps scales is shown in the right-side vertical axis. The significance of this is described below.

Mainly, once the limiting transistor channel starts to conduct, even with a very small channel current, the cell's programmed threshold voltage is a weak function of the channel's programming current. The "step-like"

dependence, which is between the cell's programmed threshold voltage and the serial-gate's applied voltage, is the key result which makes the limiter transistor very effective in the present invention.

The programming current plot of FIG. 6B demonstrates the current limiting ability of the instant invention. By inserting the current limiting transistor 50 in series with the source-side injection cell 52, a very large reduction in programming current is achieved. The magnitude of the programming current reduction can be appreciated by observation in FIG. 6B. For example, for a programming time of 10 micro-seconds with the points illustrated as circles, the programming current at Vg=1.2 volts is about 5 micro-amps, and at Vg=0.8 volts this is about 30 nano-amps, respectively, while the cell's programmed threshold voltages are nearly identical. Further, even with the limiter transistor fully turned on (with Vg=2v, say), there is no advantage in the cell's programmed threshold voltage.

To summarize the results of FIGS. 5B and 6B, the independent control functions of the select-gate 64 of the memory cell 52 and of the serial-gate 58 of the current limiter 50 are demonstrated for the first embodiment (FIG. 3): From FIG. 5B, the select-gate's function is to maximize the cell's programmed threshold voltage. From FIG. 6B, the serial-gate's function is to minimize the cell's programming current.

FIG. 7 is a sectional view showing a second preferred embodiment of the invention, in which a current limiter is integrally merged into a source-side injection cell to provide an integral device 100. Conventional isolating dielectric layers (not shown for clarity) are used between the various elements of the device. An advantage of the integral device 100 of FIG. 7 is that it is operated with only four operation terminals (instead of six terminals in the first embodiment), thus simplifying the operation of the memory cell. Also, the cell size in accordance to the second embodiment is smaller than that of the first embodiment. Another advantage is that the merged, or internalized, current limiter can serve the purpose of inhibiting cell disturbances which are caused by minute leakage channel currents in unselected cells and which often occur in regular memory array architecture, especially when a small device geometry or dimensions are involved. These advantages are explained below.

The integral device 100 of FIG. 7 is formed by combining a source-side injection cell (such as that shown in FIG. 2) together with a current limiting transistor (such as that shown in FIG. 3). The device's source junction 54 of the source-side injection cell of FIG. 3 is eliminated. The select-gate 64 of the source-side injection cell of FIG. 3 is now merged with the serial-gate 58 of the current limiter of FIG. 3 to become a "conjoint" (or "unified") gate 102, which serves a dual-function as a select-gate and as a programming current limiting gate. The device 100 includes a floating gate channel region 105 beneath the floating gate 66. The device 100 also includes a combined channel 104 between the source terminal 56 and the drain terminal 60.

The appended channel under the conjoint select-gate 102 now consists of two channel sub-sections, 106 and 108, which receive different threshold adjustment ion-implants and thus have different threshold voltages. By using different implants, the threshold voltage of the appended channel is processed to match the optimal programming voltage of the select-gate (i.e., 1.8v, see FIG. 5B for example). After the formation of the self-aligned stacked gates of the control-gate (62) and the floating gate (66), the first section of the channel 106, adjacent to the injection point of the cell, is doped with a lower boron implant dose than that received by the second appended channel section 108, located adjacent to the source terminal 56, so that the resultant threshold voltage of the second channel 108 is approximately 0.5 to 0.7 volts higher than the threshold voltage of the first channel section 106. The matching requirement on the optimal differential threshold voltages between the two channel sections is key to the minimization of the programming current in this embodiment of the present invention.

The threshold adjustment implant defines the appended current limiting channel sub-section 108 under the gate 102.

Under the conjoint select-gate 102 is a joint channel which includes two channel sections: a select-gate channel section 106 and an appended channel section 108. The select-gate channel section 106 functions in the same manner as the original select-gate channel of the source-side injection cell 64 of FIG. 3. And the appended channel section 108 functions in the same manner as the original current limiter channel of the first embodiment with six terminals of the invention. The distinction between the two channel sections 106 and 108 lies only in their different threshold voltages. The two channels, 106 and 108, directly under the conjoint gate 102, share a simple gate oxide.

FIG. 8A shows a schematic circuit diagram of the embodiment of FIG. 7, where all corresponding elements are identified using the same numbers as those used in FIG. 3, such as the device source 56, the drain 60, and the control-gate 62, etc.

Although the conjoint select-gate 102 now carries out the combined functions of the original select-gate of the memory cell and the original gate of the current limiter, it is important to note that the actual length of the conjoint select gate does not need to be the physical sum of the two original gate lengths, where they were limited by the photomask lithography. With the conjoint select-gate, the cell size of the integral device according to the second embodiment can therefore be made smaller than that of the first embodiment.

Unlike the operation of the six-terminal case in the first embodiment, where the minimization of the programming current was controlled by an independent serial-gate of the current limiter, the conjoint select-gate 102 in the four-terminal integral device 100 of the second embodiment of FIG. 7 operates with an optimized common voltage so that the programmed cell can possess the highest threshold voltage and the programming current is at its lowest. As a side benefit, the high threshold voltage used in the second embodiment's conjoint select-gate can greatly reduce the channel's sub-threshold current leakage in unselected cells in the memory array, so that cell disturbances can be more easily prevented.

FIG. 8B shows the construction of an array 94 built with multiple integral devices of the second embodiment as shown in FIG. 7 or FIG. 8A. In contrast to the array of FIG. 4B for the first embodiment, where a common current limiter is shared by a column of cells, in the array of FIG. 8B for the second embodiment each memory cell has a built-in current limiter of its own.

The key processing steps of the various fabrication methods used to realize the second embodiment of the integral memory device of FIGS. 7 and 8A are shown in FIGS. 9A, 10A, and 11A as presented hereinbelow. The two channel sections 108 and 106 under the unified select-gate 102 are doped differently. The appropriate implant dosage conditions and subsequent thermal treatment are selected such that the final resultant threshold voltage of the appended channel section 108 is about one-half volt higher than the threshold voltage of the first channel section 106.

FIG. 9A illustrates one method of fabrication for an integral device 100 as shown in FIG. 7. This fabrication technique provides for formation of the appended current limiter channel sub-section 108 shown in FIG. 7. It uses a dedicated threshold dose implant photoresist mask 120 to expose a portion 110 of the unified channel which requires a heavier implant and which is away from the lighter doped portion 106 in a substrate 122, to a boron ion-beam 116. Standard processing steps are followed for forming the conjoint select-gate 102. Source and drain implants are used for the junctions of 56 and 60. The final cell 100a is shown in FIG. 9B and resembles the integral device with a built-in current limiter in the appended channel 108 as shown in FIG. 7.

FIG. 10A illustrates another embodiment of a fabrication technique used to provide an integral device 100 of FIG. 7 by using a tilted ion-implant beam 126 through the regional photoresist mask 124. In this technique, the appended channel section 108 is formed in an area 110 using a tilting angle threshold adjustment implant beam 126. This method relies on a shadowing effect, in a self-aligned manner, provided by the elevated stack of the control-gate 62 and the floating gate 66 so that the heavier implanted channel portion 108 is located away from the lightly implanted portion 106. Following standard processing steps, a finished cell 100b is shown in FIG. 10B, which resembles that of FIG. 7 for the second embodiment.

FIG. 11A illustrates yet another embodiment of the fabrication technique. It also relies on a tilted ion-implant beam 136, but uses the formed select-gate as a self-aligned implant mask combined with a source junction formation photoresist mask 130. Subsequent thermal diffusion forms the appended channel section 106. The heavier doping portion 108 and the lighter doping portions 106 can thus be distinctly created. Following standard processing steps, a finished cell 100c is shown in FIG. 11B, which resembles that of FIG. 7 for the second embodiment. With little concern for mis-alignment of the photoresist mask 130 in FIG. 11A, the implanted boron pocket 110 is self-aligned to the conjoint select-gate 102 to form the heavier doped channel sub-region 108 away from the lightly doped section 106. This technique provides the smallest effective cell size among the methods proposed. This technique uses, for example, a tilting angle of about, but not limited to, 60 degrees from the normal axis of the substrate.

The resulting integral memory devices 100a, 100b, & 100c provided by the techniques illustrated in FIGS. 9A, 10A, 11A have the same number (i.e., four) of operation terminals as does a stand-alone source-side injection cell such as that illustrated in FIG. 7 or FIG. 2. Hence, an integral cell according to the second embodiment of the present invention is able to operate in the same or similar manner as a conventional source-side injection cell. With a built-in programming current limiter in each integral memory cell and with having a one-half volt difference between the thresholds for the two channel sub-sections under the conjoint select-gate, the resulting structure ensures that the optimal programming speed occurs at the same operational conditions as for the minimized programming current in the injection mode.

In describing the programming current limiter technique, fabrication techniques of the disclosed memory devices, and their operational conditions, it is understood that well-known processing steps, memory cell elements, and operations were not described in detail or omitted in order not to unnecessarily obscure the present invention. It should be obvious to those skilled in the art that the specific details mentioned in this document need not be carried out in complete accordance therewith to practice the present invention. Many alterations or modifications of the present invention will no doubt become apparent to one familiar with the art after having read the foregoing description, it is to be understood that the basic idea and the particular embodiments described or shown by way of illustration are in no way intended to be considered limiting. Therefore, reference to the details of the preferred embodiments are not intended to limit the scope of the claims which themselves recite only those features regarded as essential to the invention.

I claim:

1. An integral flash memory EEPROM cell (100) having a merged programming current limiter, comprising:

a source region (56) and a drain region (60) formed in a semiconductor substrate to provide a channel region (104) therebetween;

a floating-gate electrode (66) spaced apart over a portion of the channel region (104) and defining a floating-gate channel region (105);

a control-gate (62) spaced-apart over said floating gate;

a conjoint select-gate electrode (102) having a first portion spaced-apart over a portion of the channel region (104), said first portion of the conjoint select-gate electrode (102) being located adjacent to the floating-gate electrode (66) and extending between the floating-gate electrode and the source region (56) of the integral cell;

said conjoint select-gate electrode having a second portion spaced apart over the control gate (62) and connected to the first portion of the conjoint select-gate electrode;

wherein the first portion of the channel region over which the conjoint select-gate electrode (102) extends includes a first channel sub-section (106) located adjacent to the floating gate channel region (105), and a second channel sub-section (108) located between said first sub-channel section (106) and said source region (56); and wherein the second channel sub-section (108) is doped higher than the first channel sub-section (106) such that the resultant threshold voltage of the second channel sub-section is higher than the threshold voltage of the first sub-section; and an operating terminal connected to the conjoint select-gate, wherein both the first and the second channel sub-sections under the conjoint select-gates are adapted to be simultaneously controlled by the same conjoint voltage of the operating terminal of the conjoint select-gate electrode.

2. The integral flash memory EEPROM cell of claim 1 wherein second section (108) of the channel region (104) is doped higher the first sub-section (106) such that the resultant threshold voltage of the second sub-section is approximately one-half volt higher than the threshold voltage of the first sub-section so that, during programming, a maximized charge injection is provided to the floating-gate electrode using a conjoint select-gate voltage which provides a minimized programming current through the memory cell channel (104).

3. The integral flash memory EEPROM cell of claim 1 including a plurality of four-terminal integral flash EEPROM cells forming a flash memory EEPROM array, wherein the source terminals of the cells are joined together to become a common source-line (98), the drain terminals of the cells are joined together to become a common drain-line (96), and the conjoint select-gates of the cells are independent word-lines of the array such that the control-gates (62a–62n) of the cells can be adapted to either be joined together for connection to a common voltage or to be independently selected for connection to different voltages.

* * * * *